US00RE46819E

(19) United States
(12) Reissued Patent
Gillingham et al.

(10) Patent Number: US RE46,819 E
(45) Date of Reissued Patent: May 1, 2018

(54) SYNCHRONOUS MEMORY READ DATA CAPTURE

(71) Applicant: Conversant Intellectual Property Management Inc., Ottawa (CA)

(72) Inventors: Peter Gillingham, Kanata (CA); Robert McKenzie, Ottawa (CA)

(73) Assignee: Conversant Intellectual Property Management Inc., Ottawa (CA)

(21) Appl. No.: 14/141,686

(22) Filed: Dec. 27, 2013

Related U.S. Patent Documents

Reissue of:
(64) Patent No.: 8,086,813
Issued: Dec. 27, 2011
Appl. No.: 12/619,238
Filed: Nov. 16, 2009

U.S. Applications:
(63) Continuation of application No. 11/477,659, filed on Jun. 30, 2006, now Pat. No. 7,685,393.

(51) Int. Cl.
*G06F 13/42* (2006.01)
*G11C 29/50* (2006.01)
*G11C 7/10* (2006.01)

(52) U.S. Cl.
CPC ..... *G06F 13/4243* (2013.01); *G11C 7/1066* (2013.01); *G11C 29/50012* (2013.01); *G11C 2207/2254* (2013.01)

(58) Field of Classification Search
CPC ..... G11C 7/02; G11C 7/1051; G11C 7/1093; G11C 7/1066; G11C 7/222;
(Continued)

(56) References Cited

U.S. PATENT DOCUMENTS 6,256,260 B1 7/2001 Shim et al.
6,466,491 B2 * 10/2002 Yanagawa ..... G06F 13/1689
(Continued)

FOREIGN PATENT DOCUMENTS

JP 2003099321 A 4/2003
WO 2006/023387 3/2006

OTHER PUBLICATIONS

"DDR-SDRAM-2: Detailed Specifications" published in FIND, vol. 16, No. 4, Nov. 1998.*
LSI Logic 0.11 μm DDR2 PHY cw000733_1_0; Feb. 2005.

*Primary Examiner* — Sam Rimell
(74) *Attorney, Agent, or Firm* — Borden Ladner Gervais LLP

(57) ABSTRACT

A method of snap-shot data training to determine the optimum timing of the DQS enable signal in a single read operation is provided. This is accomplished by first writing a Gray code count sequence into the memory and then reading it back in a single burst. The controller samples the read burst at a fixed interval from the time the command was issued to determine the loop-around delay. A simple truth table lookup determines the optimum DQS enable timing for normal reads. Advantageously, during normal read operations, the first positive edge of the enabled DQS signal is used to sample a counter that is enabled every time a command is issued. If the counter sample changes, indicating timing drift has occurred, the DQS enable signal can be adjusted to compensate for the drift and maintain a position centered in the DQS preamble. This technique can also be applied to a system that uses the iterative approach to determining DQS enable timing on power up. Another embodiment of the invention is a simple, low latency clock domain crossing circuit based on the DQS latched sample of the counter.

16 Claims, 13 Drawing Sheets

(58) Field of Classification Search
CPC ..... G11C 29/50012; G06F 13/4243; G06F 13/1689; G06F 13/4234; G11K 2207/2254
See application file for complete search history.

(56) References Cited

U.S. PATENT DOCUMENTS

| | | | | |
|---|---|---|---|---|
| 6,600,681 | B1 | 7/2003 | Korger et al. | |
| 6,690,745 | B1 | 2/2004 | Horii et al. | |
| 6,691,214 | B1 * | 2/2004 | Li et al. | G11C 7/02 |
| 6,889,336 | B2 | 5/2005 | Schoenfeld et al. | |
| 8,086,813 | B2 * | 12/2011 | Gillingham et al. | G06F 13/4243 |
| 8,121,237 | B2 * | 2/2012 | Stott et al. | G11C 7/1051 |
| 2002/0126564 | A1 | 9/2002 | Yoo et al. | |
| 2003/0200364 | A1 * | 10/2003 | Vakil et al. | 710/36 |
| 2005/0213396 | A1 | 9/2005 | Aoki | |
| 2006/0044029 | A1 | 3/2006 | Gomm et al. | |
| 2006/0136769 | A1 | 6/2006 | Kizer et al. | |

* cited by examiner

| Initialization Sampling on 16, 17, 18 and 19: | | | | Normal Operation DQS90 ↑ Sampled Count | DQS Enable | DQS Disable | | DQ0 DQ1 Sampling | |
|---|---|---|---|---|---|---|---|---|---|
| 0° | 90° | 180° | 270° | | | BL8 | BL4 | BL8 | BL4 |
| 10 | 10 | 10 | 10 | 3 | 1 | 16 | 8 | 180° | 0° |
| 11 | 10 | 10 | 10 | 4 | 2 | 17 | 9 | 180° | 0° |
| 11 | 11 | 10 | 10 | 5 | 3 | 18 | 10 | 0° | 180° |
| 11 | 11 | 11 | 10 | 6 | 4 | 19 | 11 | 0° | 180° |
| 11 | 11 | 11 | 11 | 7 | 5 | 20 | 12 | 180° | 0° |
| 01 | 11 | 11 | 11 | 8 | 6 | 21 | 13 | 180° | 0° |
| 01 | 01 | 11 | 11 | 9 | 7 | 22 | 14 | 0° | 180° |
| 01 | 01 | 01 | 11 | 10 | 8 | 23 | 15 | 0° | 180° |
| 01 | 01 | 01 | 01 | 11 | 9 | 24 | 16 | 180° | 0° |
| 00 | 01 | 01 | 01 | 12 | 10 | 25 | 17 | 180° | 0° |
| 00 | 00 | 01 | 01 | 13 | 11 | 26 | 18 | 0° | 180° |
| 00 | 00 | 00 | 01 | 14 | 12 | 27 | 19 | 0° | 180° |
| 00 | 00 | 00 | 00 | 15 | 13 | 28 | 20 | 180° | 0° |

FIG. 3

| IS[7:4], IS[3:0] $b_2$, $b_1$, $b_0$ read on 3 successive 16 bit bursts | | | | DQS90 | DQS90 Disable | | DQ0 | DQ1 | DQS90 | Samp. |
|---|---|---|---|---|---|---|---|---|---|---|
| 0° | 90° | 180° | 270° | Enable | BL4 | BL8 | Sampling | | 90° | 180° |
| 100 | 100 | 100 | 100 | 10 | 17 | 25 | 180° | 0° | 0 | 1 |
| 101 | 100 | 100 | 100 | 11 | 18 | 26 | 180° | 0° | 0 | 0 |
| 101 | 101 | 100 | 100 | 12 | 19 | 27 | 0° | 180° | 1 | 0 |
| 101 | 101 | 101 | 100 | 13 | 20 | 28 | 0° | 180° | 1 | 1 |
| 101 | 101 | 101 | 101 | 14 | 21 | 29 | 180° | 0° | 0 | 1 |
| 111 | 101 | 101 | 101 | 15 | 22 | 30 | 180° | 0° | 0 | 0 |
| 111 | 111 | 101 | 101 | 16 | 23 | 31 | 0° | 180° | 1 | 0 |
| 111 | 111 | 111 | 101 | 17 | 24 | 32 | 0° | 180° | 1 | 1 |
| 111 | 111 | 111 | 111 | 18 | 25 | 33 | 180° | 0° | 0 | 1 |
| 110 | 111 | 111 | 111 | 19 | 26 | 34 | 180° | 0° | 0 | 0 |
| 110 | 110 | 111 | 111 | 20 | 27 | 35 | 0° | 180° | 1 | 0 |
| 110 | 110 | 110 | 111 | 21 | 28 | 36 | 0° | 180° | 1 | 1 |
| 110 | 110 | 110 | 110 | 22 | 29 | 37 | 180° | 0° | 0 | 1 |
| 010 | 110 | 110 | 110 | 23 | 30 | 38 | 180° | 0° | 0 | 0 |
| 010 | 010 | 110 | 110 | 24 | 31 | 39 | 0° | 180° | 1 | 0 |
| 010 | 010 | 010 | 110 | 25 | 32 | 40 | 0° | 180° | 1 | 1 |
| 010 | 010 | 010 | 010 | 26 | 33 | 41 | 180° | 0° | 0 | 1 |
| 011 | 010 | 010 | 010 | 27 | 34 | 42 | 180° | 0° | 0 | 0 |
| 011 | 011 | 010 | 010 | 28 | 35 | 43 | 0° | 180° | 1 | 0 |
| 011 | 011 | 011 | 010 | 29 | 36 | 44 | 0° | 180° | 1 | 1 |
| 011 | 011 | 011 | 011 | 30 | 37 | 45 | 180° | 0° | 0 | 1 |
| 001 | 011 | 011 | 011 | 31 | 38 | 46 | 180° | 0° | 0 | 0 |
| 001 | 001 | 011 | 011 | 32 | 39 | 47 | 0° | 180° | 1 | 0 |
| 001 | 001 | 001 | 011 | 33 | 40 | 48 | 0° | 180° | 1 | 1 |
| 001 | 001 | 001 | 001 | 34 | 41 | 49 | 180° | 0° | 0 | 1 |
| 000 | 001 | 001 | 001 | 35 | 42 | 50 | 180° | 0° | 0 | 0 |
| 000 | 000 | 001 | 001 | 36 | 43 | 51 | 0° | 180° | 1 | 0 |
| 000 | 000 | 000 | 001 | 37 | 44 | 52 | 0° | 180° | 1 | 1 |
| 000 | 000 | 000 | 000 | 38 | 45 | 53 | 180° | 0° | 0 | 1 |

FIG. 6

SYNCHRONOUS MEMORY READ DATA CAPTURE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

RELATED APPLICATION

This application is a continuation of application Ser. No. 11/477,659, filed Jun. 30, 2006, now U.S. Pat. No. 7,685,393, issued on Mar. 23, 2010, which is hereby incorporated by reference in its entirety.

FIELD OF THE INVENTION

The present invention relates generally to synchronous memories and associated memory controllers. More particularly, the present invention relates to the control and transfer of read and write data between a memory controller and a synchronous memory using bi-directional databusses and bidirectional data strobe signals.

BACKGROUND OF THE INVENTION

In source synchronous signaling, a data strobe clock is driven by the transmitting device along with the data. The clock and data paths from transmitter to receiver are matched. At the receiving device the data strobe clock is used to latch incoming data. In Double Data Rate (DDR) SDRAM memory systems, the external databuses are bidirectional. Write data is sent to the memory from a memory controller and read data is sent from the memory to the controller. When no data is being sent, the bus returns to a tri-state level defined by the bus transmission line termination voltage.

Control of the bidirectional data strobe clock also changes depending on which device is driving data onto the databus. The data strobe clock input on the controller and the memory device must be gated by an enable signal to prevent the spurious clock edges created by a tri-stated clock input level from triggering internal data capture. When neither the memory controller nor the memory is driving the data strobe, the data strobe line will be pulled to the bus termination voltage by the termination resistor. For DDR and DDR2 memories, the termination voltage Vterm is Vddq/2, which is the same as the input buffer reference voltage Vref. As a result, the data strobe input buffer produces an indeterminate value, which may change between '0' and '1' depending on noise. On the memory chip this is easily accomplished because the write data instruction and the write data itself arrive source synchronously from the controller and the skew between the two sets of signals will be less than one bit period. Before the first active edge of the data strobe clock DQS there is a 2 bit preamble period during which DQS is driven low. During this time the memory chip can assert the enable signal.

During read operations the alignment between read command and read data on the bidirectional bus is much less certain. The delay through the command and address output drivers, through the package and printed circuit board connections to the memory device, back through the read data output buffers, package, and printed circuit board, and finally through the input buffers of the memory controller can vary by many bit periods depending on the system configuration and operating conditions.

A first problem associated with this alignment of read command and data is to determine, on system initialization, where in time to position the read data DQS enable signal so that it falls within the 2 bit preamble. A second problem is how to adjust for timing drift during operation caused by temperature or supply voltage drift. A third problem is how to transfer data clocked in with DQS to the system clock domain when the phase between the DQS clock and master system clock CLK can be completely arbitrary.

These problems did not exist in single data rate SDRAMs because there was no DQS clock and read data had to meet setup and hold requirements with respect to the master system clock CLK which originates from the controller.

Quad Data Rate (QDR) SRAM does not have the problem because separate read and write data busses exist with their own dedicated clocks. Since the clocks do not have to be tri-stated there is never any indeterminate state.

An application of a bidirectional data strobe signal to DDR SDRAM is disclosed in U.S. Pat. No. 6,889,336 granted to A. M. Schoenfeld et al. on May 3, 2005. At the initial DDR operating speeds DDR267 and DDR333, the 2 bit preamble period was still relatively large, 7.5 ns and 6.66 ns respectively. It was still possible to accommodate a range of system designs and operating conditions with fixed timing on the internal DQS enable. With DDR400 and DDR2 devices ranging from DDR2-400 to DDR2-800, there is a need for dynamic adjustment of the DQS enable time. An example set of typical loop-around read timing delays of a chip-to-chip controller to DDR SDRAM are as follows:

| Delay from; | min. | max. |
|---|---|---|
| Command latch to controller pin | 1.0 ns | 3.0 ns |
| PCB trace to DDR SDRAM | 0.5 ns | 1.5 ns |
| SDRAM command in to data out | −0.5 ns | 0.5 ns |
| PCB trace to controller | 0.5 ns | 1.5 ns |
| Controller pin to data latch | 1.0 ns | 3.0 ns |
| TOTAL | 2.5 ns | 9.5 ns |

The read data timing can vary by more than the width of the DQS preamble interval at data rates for DDR400 and higher. Fixed timing is not a robust solution.

As an example, several implementations of DQS gating are described in the LSI Logic 0.11 um DDR2 PHY document cw000733_1_0 dated February 2005. The PHY actually supports three different approaches for enabling the DQS read strobe, using a signal called GATEON.

The first approach "Programmable GATEON" allows the user to program the timing of GATEON based on a programmable delay register and the time the read command is issued. Read data training is required with this scheme. Read data training involves attempting a number of read operations with different delay register settings, finding the settings for which expected data is properly received, and then setting the delay register somewhere in the middle of the pass range. A disadvantage of this approach is that it requires higher level intelligence somewhere in the controller, and a significant amount of time during system initialization to determine the optimum setting. Also, it cannot accommodate timing drift during operation.

The second approach is called "Feedback GATEON". A signal is generated and sent to a pin in the same way a command is generated. This signal can be routed along a PCB trace with the same length and loading as the command signal to the memory and back to the controller. At the controller the delayed signal is used to trigger the DQS enable. The disadvantage of this approach is that it requires 2 additional pins, PCB traces, and consumes power. It does not perfectly match the actual command to read data loop-around delay.

The final approach is called "External GATEON" where the user somehow generates the GATEON signal. This method would also require at least one additional pin. This also requires some interconnect that mimics the behaviour of the actual databus.

SUMMARY OF THE INVENTION

According to one broad aspect, the invention provides a method for controlling a memory, the method comprising: measuring a read delay between the memory and a memory controller; writing an initialization sequence to predetermined locations of the memory; sending a read command to the memory to read the predetermined locations and receiving returned data signals; and a predetermined time after sending the read command, sampling the returned data signals to produce an initialization sample that is used to determine the read delay between the memory and the memory controller.

For example, the memory includes a DDR SDRAM memory or a slave device on a bidirectional bus with bidirectional source synchronous strobes.

According to another broad aspect, the invention provides a memory controller for controlling a memory, the controller comprising: a read delay determination circuit and a DQS enable circuit; during initialization, the read delay determination circuit determining a read delay between sending a read command to the memory and receiving data signals in return, the read delay determination circuit comprising a circuit for sampling the data at a predetermined time to produce an initialization sample, and a lookup table that stores a respective read delay in respect of each permutation of the initialization sample; the DQS circuit being adapted to gate a received DQS clock signal as a function of the read delay.

For example, the memory includes a DDR SDRAM memory.

One embodiment of the invention provides a method in a memory controller for controlling a memory that has a bidirectional read/write bus with source synchronous clocking and a bidirectional data strobe, the method comprising: measuring a read delay between the memory and the memory controller by: the memory controller writing a Gray code initialization sequence to predetermined locations of the memory; the memory controller sending a read command to the memory to read the predetermined locations and receiving returned data signals; a predetermined time after sending the read command, the memory controller sampling the returned data signals to produce an initialization sample; using the initialization sample to determine the read delay between the memory and the memory controller.

Another embodiment of the invention provides a memory controller for controlling a memory that has a bidirectional read/write bus with source synchronous clocking and a bidirectional data strobe, the controller comprising: a read delay determination circuit and a data strobe enable circuit; during initialization, the read delay determination circuit determining a read delay between sending a read command to the DDR SDRAM and receiving data signals in return, the read delay determination circuit comprising a circuit for sampling the data at a predetermined time to produce an initialization sample, and a table lookup function that stores a respective read delay in respect of each permutation of the initialization sample; the data strobe enable circuit being adapted to gate a received DQS as a function of the read delay.

Another embodiment of the invention provides a data strobe enable circuit for use with a memory that has a bidirectional read/write bus with source synchronous clocking and a bidirectional data strobe, the circuit comprising: an input for receiving a data strobe signal; an output for producing a gated data strobe signal; an data strobe enable and data strobe disable; a multiplexer that gates the data strobe signal as a function of a select input; a select input generator circuit that sets the select input to select the data strobe signal upon activation of the data strobe enable, and that sets the select input to deselect the data strobe signal upon activation of the data strobe disable and following a next rising edge of the data strobe signal.

Another embodiment of the invention provides a drift detector circuit comprising: a first circuit for latching a first value of a first phase of a master clock synchronously with an input clock signal; a second circuit for latching a second value of a second phase of the master clock synchronously with the input clock signal; wherein a change in either the first value or the second value indicates that the input clock signal has drifted relative to the master clock source by at least a predetermined amount.

An embodiment of the invention provides a method of snap-shot data training to determine the optimum timing of the DQS enable signal in a single read operation. This is accomplished by first writing a Gray code count sequence into the memory and then reading it back in a single burst. The controller samples the read burst at a fixed interval from the time the command was issued to determine the loop-around delay. A simple truth table lookup determines the optimum DQS enable timing for normal reads.

Advantageously, during normal read operations, the first positive edge of the enabled DQS signal is used to sample a counter that is enabled every time a command is issued. If the counter sample changes, indicating timing drift has occurred, the DQS enable signal can be adjusted to compensate for the drift and maintain a position centered in the DQS preamble. This technique can also be applied to a system that uses the iterative approach to determining DQS enable timing on power up.

Another embodiment of the invention is a simple, low latency clock domain crossing circuit based on the DQS latched sample of the counter.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 3 is a look-up table for determining read delay as a function of an initialization sample corresponding to the examples of FIGS. 2A, 2B and 2C;

FIG. 6 is a look-up table corresponding to the example of FIG. 5;

DETAILED DESCRIPTION

In the following detailed description of sample embodiments of the invention, reference is made to the accompanying drawings which form a part hereof, and in which is shown by way of illustration specific sample embodiments in which the present invention may be practiced. These embodiments are described in sufficient detail to enable those skilled in the art to practice the present invention, and it is to be understood that other embodiments may be utilized and that logical, mechanical, electrical, and other changes may be made without departing from the scope of the present invention. The following detailed description is, therefore, not to be taken in a limiting sense, and the scope of the present invention is defined by the appended claims.

Figure 1:
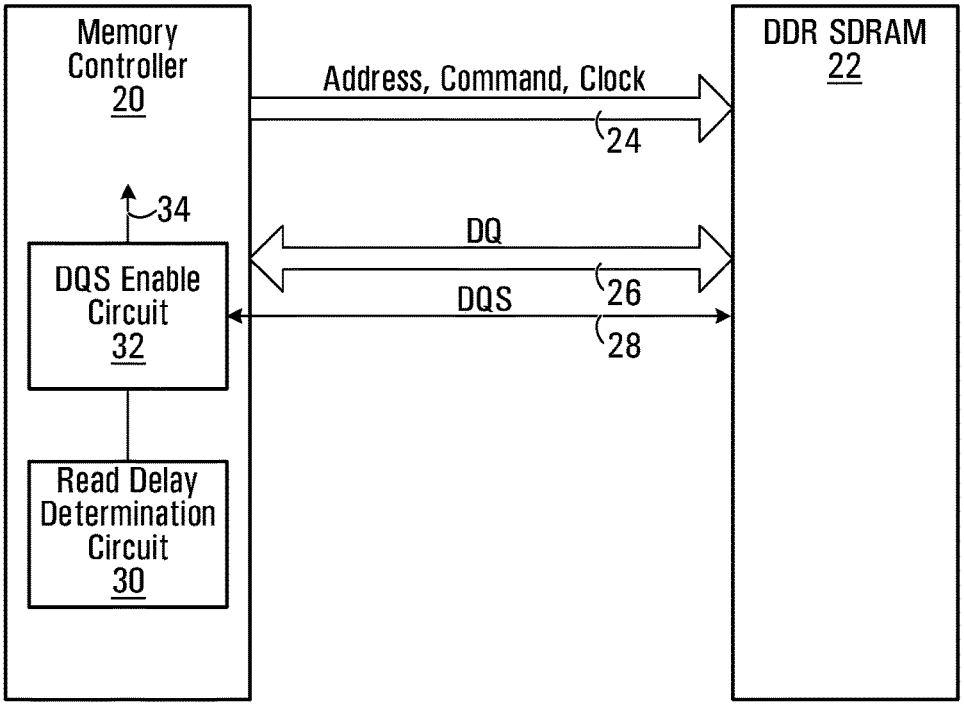
FIG. 1 is a block diagram of an SDRAM device with read delay determination, provided by an embodiment of the invention.

Referring now to FIG. 1, shown is a memory controller 20 connected to a DDR-SDRAM 22 through connections including: a unidirectional bus 24 used to send addresses, commands and clock from the memory controller 20 to the DDR SDRAM 22; a bi-directional bus 26 for writing data to the DDR SDRAM 22 and reading data from the memory, with the signals on bus 26 indicated as "DQ"; a bi-directional connection 28 for carrying a data strobe clock (DQS). In a write operation, the DQS is generated synchronously with the write data by the memory controller 20. In a read operation, read data from the DDR SDRAM 22 and the DQS are generated synchronously by the memory. The memory controller 20 has a read delay determination circuit 30 that determines the read delay between the memory controller 20 and the DDR SDRAM 22. The memory controller 20 has a DQS enable circuit 32 that generates a gated DQS signal 34 based on the incoming DQS signal 28 as a function of an output of the read delay determination circuit 30.

For this example, the memory controller is a synchronous ASIC circuit that operates with a main clock. A master DLL inside the controller (not shown) derives a 0° phase difference clock which is phase locked to the main clock, and also 90°, 180°, and 270° phases (not shown). A slave DLL also inside the controller (not shown) creates a constant 90° phase shift.

The functionality of the read delay determination circuit 30 will now be described by way of example in further detail with further reference to FIG. 1 and the timing diagrams of FIGS. 2A, 2B and 2C. On power up, the memory controller 20 first waits for the DLL to lock and reliably produce 0°, 90°, 180°, and 270° phases, and also 90° delayed versions of DQS. This will allow the controller's data input latches to reliably capture read data. The controller 20 then sends the appropriate power up commands to the DDR SDRAM 22. This is followed by writing an initialization sequence to the memory, for example, a two bit Gray code sequence in a burst to successive byte locations in the memory. It is noted that Gray codes are not unique and that any Gray code can be employed. Bits 0 to 3 contain the LSB of the two bit Gray code, while bits 4 to 7 contain the MSB of the two bit Gray code as follows:

| Time | Bit #: 76543210 |
|---|---|
| t = 0 | 00000000 |
| t = 1 | 00000000 |
| t = 2 | 00001111 |
| t = 3 | 00001111 |
| t = 4 | 11111111 |
| t = 5 | 11111111 |
| t = 6 | 11110000 |
| t = 7 | 11110000 |

The Gray code pattern insures that only one bit changes at any one time and any slight differences in delay between the two bits will not result in erroneous counts. Writing each Gray code bit to multiple locations (four in the above example) allows for multiple samples to be taken in parallel as will be detailed below.

Figure 2A:
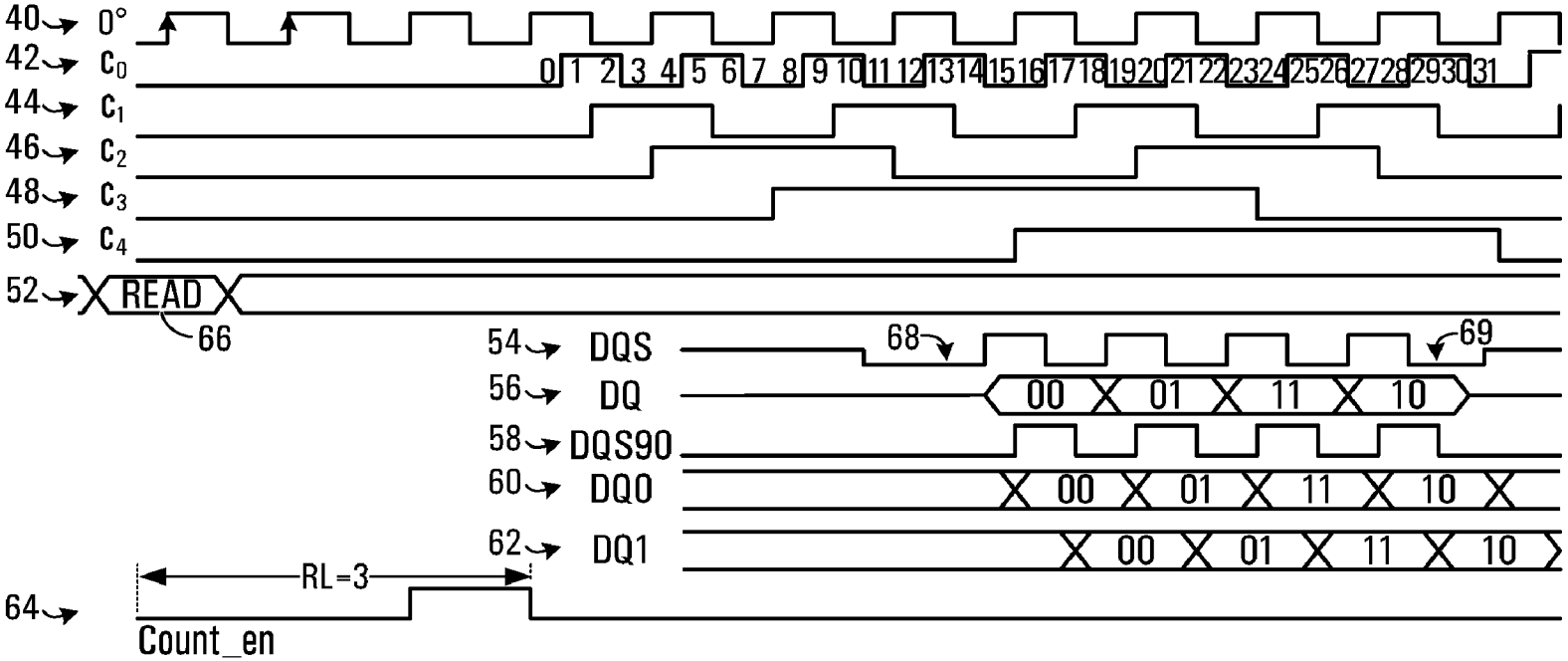
FIGS. 2A, 2B and 2C are example timing diagrams for read delay determination.

FIG. 2A shows a timing diagram for a maximum read delay case; FIG. 2B shows a timing diagram for a nominal read delay case and FIG. 2C shows a timing diagram for a minimum read delay case. Each of these timing diagrams shows a 0° clock 40, a five bit Gray code counter 42,44,46, 48,50, command sequence 52, DQS 54, DQ 56, DQS90 58, DQ0 60, DQ1 62 and count_en 64.

In each case the Gray code counter has a first bit $c_0$ 42 that alternates with the same period as the 0° clock 40, a second bit $c_1$ 44 that oscillates at twice the period of the 0° clock, a third bit $c_2$ 46 that oscillates at four times of the period of the 0° clock, a fourth bit $c_3$ 48 that oscillates with eight times of the period of the 0° clock, and a fifth bit $c_4$ 50 that oscillates with sixteen times of the period of the 0° clock. The timing of the five bits 42,44,46,48,50 is such that a five bit Gray code is generated with the code word changing on every quarter cycle of the 0° clock.

Having written the Gray code to memory as described above, the process of determining the read delay continues with a READ command 66 as part of a command sequence 52 on the rising edge of the 0° clock 40. The Gray code counter 42,44,46,48,50 is enabled by the falling edge of a count_en 64 that accounts for a minimum read latency (RL) in responding to the READ command. In the illustrated example, it is assumed that the minimum read latency is three clock periods. If there are no other delays in the system, then data would start to arrive at the memory controller at the end of this time.

Assuming however that there is some other delay in the system, the DQS 54 is activated sometime later with the first rising edge of the DQS 54 being shown to be preceded by a two bit preamble 68. Note that while the DQS is not active, it is in a high impedance state approximately midway between logic high and logic low. DQS 54 is active long enough to complete the read for a particular block length. This is followed by a postamble 69 after which it returns to the high impedance state.

Data signal DQ 56 is received from the memory synchronously with the DQS 54. Because it is a double data rate system, a bit is received on DQ 56 for each rising edge and each falling edge of the DQS 54. In order to perform the snapshot data training, the read command 66 is issued in association with the address in the memory to which the Gray code sequence was written as described above. DQS90 58 is a 90° phase shifted version of DQ 56 that is generated to allow sampling edges centered in the middle of the received data pulses. This can be produced with the slave DLL for example. DQ0 60 shows the data latched on the rising edge of DQS90 58, while DQ1 62 shows the data latched with the falling edge of the DQS90 58.

Figure 2B:
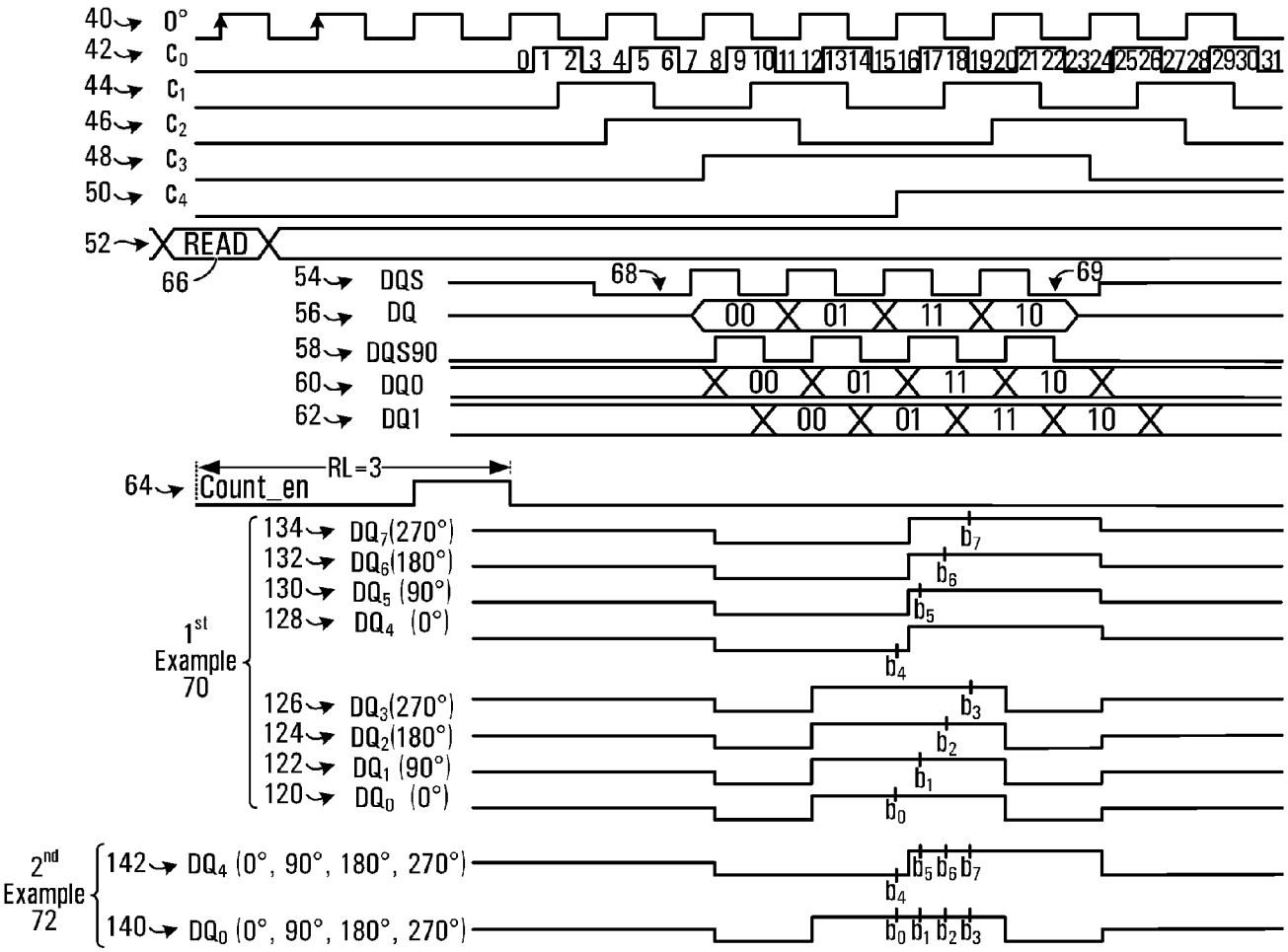
Figure 2C:
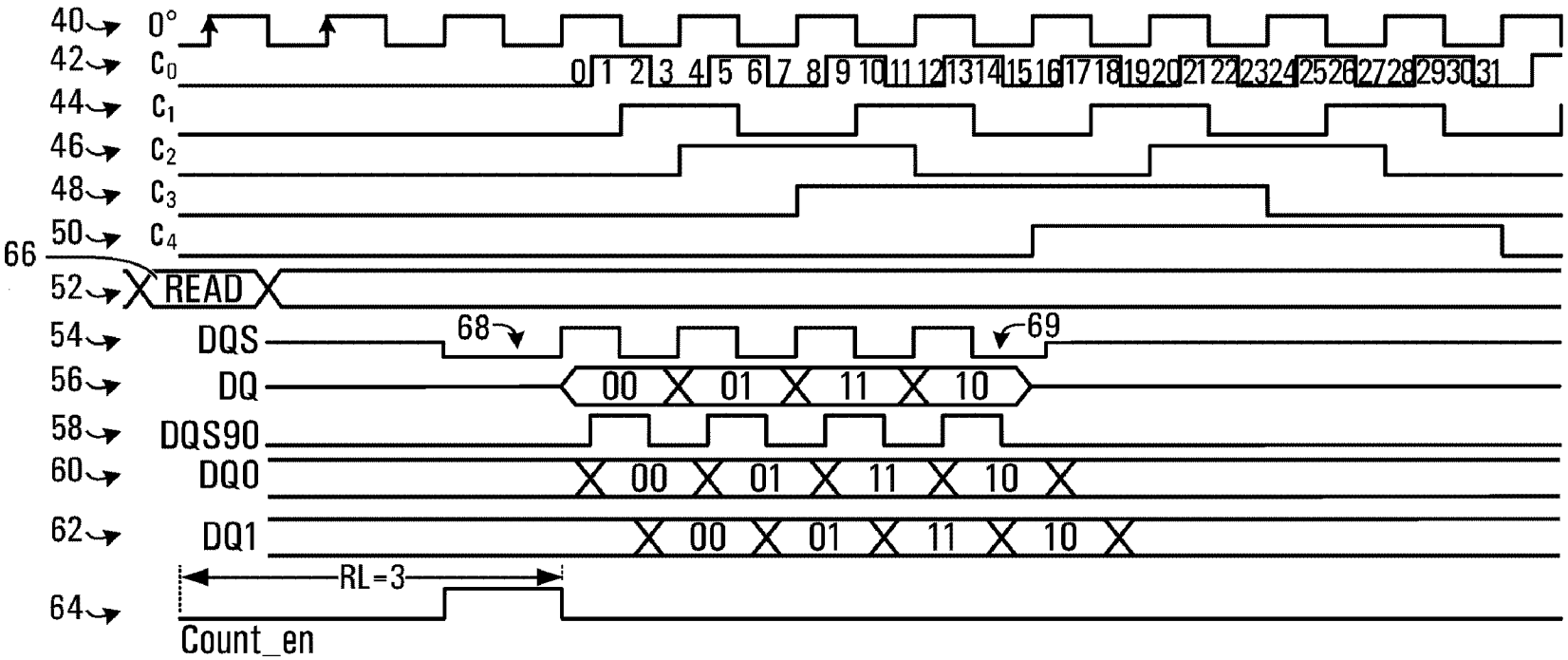

In FIGS. 2A, 2B and 2C, DQ, DQ0 and DQ1 employ a shorthand notation to summarize the bits read from all 8 bits of the stored Gray code. DQ, DQ0 and DQ1 all show the contents being read from the stored two bit Gray code at a given instant of time. DQ, DQ0, DQ1="00" means that during that time the first bit of the Gray code read from any memory location to which the first bit was written is "0", and the second bit of the Gray code read from any memory location to which the second bit was written is "0". The full details for the individual bits $DQ_1$, . . . , $DQ_8$ are shown in FIG. 2B only.

Comparing FIGS. 2A, 2B, 2C it can be seen that depending upon the read delay, the read data DQ 56 begins to arrive from the memory at different times, and the different times can be associated with different states of the Gray code counter 42,44,46,48,50.

In a first example implementation, generally indicated at 70 in FIG. 2B, each of eight input bits has a respective extra input latch which samples input latched read data DQ0 with a single phase of the controller clock. In FIG. 2B, the data on the eight bits is indicated at $DQ_0$ through $DQ_7$ 120,122, 124, 126,128,130,132,134. It can be seen that bits $DQ_0$ through $DQ_3$ capture the LSB of the two bit Gray code while bits $DQ_4$ through $DQ_7$ capture the MSB of the two bit Gray code. In the illustrated example, it is assumed that $DQ_0$ and $DQ_4$ are latched with a 0° phase; $DQ_1$ and $DQ_5$ are latched with a 90° phase, $DQ_2$ and $DQ_6$ are latched with a 180° phase, and $DQ_3$ and $DQ_7$ are latched with a 270° phase. By sampling the contents of these eight latches at a defined instant, an initialization sample is generated. In the illustrated example, the 0° samples are taken at seven full clock cycles after issuing the READ command, and the 90°, 180°, 270° samples are taken subsequent to this. The 0° samples are labeled $b_0$, $b_4$; the 90° samples are labeled $b_1$, $b_5$; the 180° samples are labeled $b_2$, $b_6$; and the 270° samples are labeled $b_3$, $b_7$.

The various permutations of the initialization samples are organized into a truth table as shown by way of example in FIG. 3. This table can be implemented as logic circuitry, for example registers, or a Read Only Memory (ROM) within the memory controller. In this case, the initialization sample is shown in a table with the bits organized by sampling phase. Each initialization sample has eight bits, and in the table the first two bits are the two bits sampled with the 0° degree phase ($b_0$ and $b_4$ in the example of FIG. 2B); the next two bits are the bit sampled with the 90° phase ($b_1$ and $b_5$ in the example of FIG. 2B); the next two bits are those sampled at the 180° phase (bits $b_2$ and $b_6$ for the example of FIG. 2B) and the next two bits are the two bits that were sampled at the 270° phase (bits $b_3$ and $b_7$ in the example of FIG. 2B). This approach necessitates the Gray code sequence to have been written to the memory as indicated above, with the first bit of a two bit Gray code sequence being written to bits 0 through 3 of each byte, and a second bit of the two bit Gray code sequence being written to bits 4 through 7 of each byte.

Alternatively, the same initialization sample could be generated using only two bits to which the two bit Gray code sequence was written. This is shown in the second example of FIG. 2B generally indicated at 72 where it is assumed the first bit is read on $DQ_0$ and the second bit is read on $DQ_4$. In this case, it is necessary to sample each of $DQ_0$ and $DQ_4$ with all four clock phases. The eight samples can then be used to generate the same initialization sample as discussed above.

FIG. 2A shows the maximum delay case. In this case, the 0°, 90°, 180°, 270° samples are "00 00 00 00". From the timing diagrams, it can be seen that the normal operation of the DQS90 first rising edge occurs near Gray count 15. Since the DQS 54 has a two bit preamble, enabling DQS at Gray count 13 will ensure that it is enabled for the first rising edge. For a burst length of four, the DQS would be disabled at approximately Gray count 20 whereas for a burst length of eight the DQS would be disabled around Gray count 28. Referring to the truth table of FIG. 3, it can be seen that this information is entered into the table in association with the initialization sample "00 00 00 00".

FIG. 2B shows a nominal delay case. The 0°, 90°, 180° and 270° samples are "01 11 11 11" and these correspond to the sixth row of the table in FIG. 3. Finally, FIG. 2C shows the minimum delay case and the 0°, 90°, 180°, 270° samples are "10 10 10 10" these corresponding with the first row in the truth table of FIG. 3. The table also includes in the right two columns an indication of which clock phase should be used to sample DQ0 and DQ1 as a function of the delay. This specifies how to move data over into the clock domain of the controller, i.e. synchronize data being read from the memory to the controller based on the controller's master clock using either the rising edge of the falling edge of the main 0° clock to latch the data.

Having determined the read delay, DQS enable circuit 32 of FIG. 1 enables/disables the incoming DQS and/or DQS90. More specifically, during normal read operations, the controller issues a READ command with block length BL=8 and read latency RL=3 (in this example). The count_en signal is asserted to start the Gray code counter at 0 following the 3rd clock edge after the read command was issued. Data cannot arrive any sooner than this. Note that the counter is a Gray code counter in which only a single bit will change at any time. The count value does not correspond to a normal binary encoding scheme. The counter increments every ¼ clock period. Once the counter reaches the value stored in the table for enabling or disabling (for the previously measured delay) the DQS is enabled or disabled accordingly.

In addition, the counter value is latched by the enabled DQS clock on the rising edge corresponding to the first bit of data in the data burst. This value corresponds to a row in the truth table. If the value is the same as in the previous read cycle or the initialization sequence described in the preceding paragraph, then the loop-around delay has remained constant. If the value is different the timing has drifted and the DQS enable timing must be updated by the controller.

Figure 4:
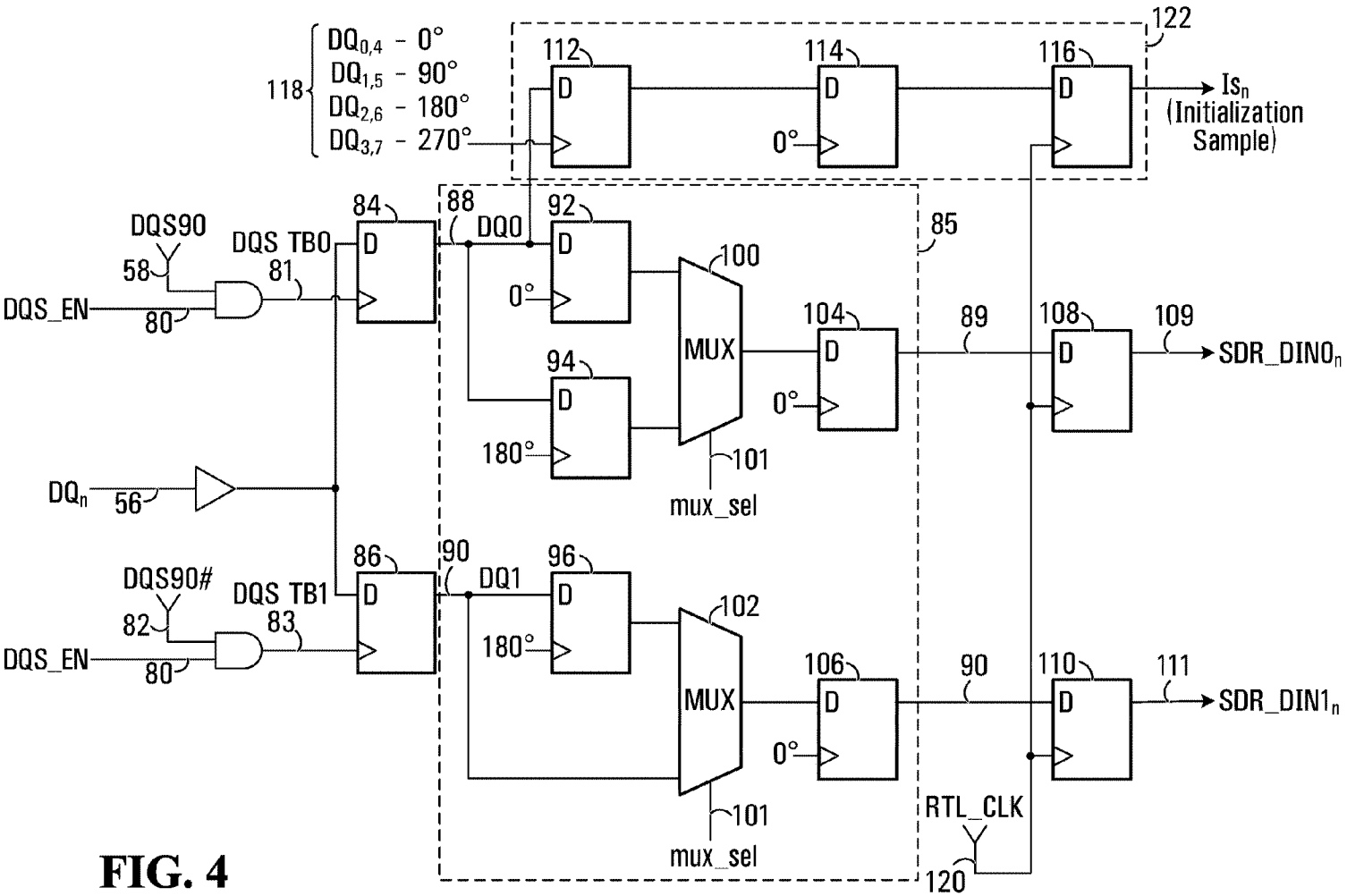
FIG. 4 is a circuit diagram for receiving read data in a memory controller and for generating an initialization sample corresponding to the examples of FIGS. 2A, 2B and 2C.

Referring now to FIG. 4, shown is the functional circuitry in the memory controller for receiving a single bit across the bidirectional bus 26 of FIG. 1, according to an embodiment of the present invention. Shown is a DQS enable labeled DQS_EN 80, this being the DQS enable input generated by the DQS enable circuit 34 of FIG. 1. The DQS enable 80 gates a DQS90 input 58, and an inverted DQS90 input 82. Recall that the DQS90 is a 90° phase shifted version of the DQS transmitted from the DDR SDRAM 22 to the memory controller 20. DQS TB0 has rising edges corresponding with rising edges of DQS90, while DQS TB1 83 has rising edges corresponding with falling edges of DQS90. The data signal is received on $DQ_n$ 56, and this is connected to the D inputs of flip-flop 84 which latches on the rising edge of DQS90 and D flip-flop 86 which latches on the falling edge of DQS90. Flip-flop 84 outputs DQ0 88, this being the data latched with a rising edge of DQS90. Flip-flop 86 outputs DQ1 90, this being the data latched on the falling edge of DQS 90.

Circuit 85 is provided to sample DQ0 88 and DQ1 90, and to produce outputs 89 and 90 that are re-timed to be synchronous with the 0° clock. This is achieved by sampling DQ0 at the 0° and the 180° clock phases with flip-flops 92 and 94 and selecting between the 0° sample and the 180° sample with a multiplexer 100 as a function of a multiplexer select input mux_sel 101. The mux_sel value used is a function of the read delay and is stored in the look-up table as discussed above. This output is then sampled at the 0° clock phase with D flip-flop 104 to produce output 89. DQ1 90 is sampled at 180° with D flip-flop 96 while the 0° sample corresponds to the output of D flip-flip 86. DQ1 is valid one half clock period later than DQ0. This effectively re-times DQ0 and DQ1 data to be valid during the same interval. Either the 180° sample or the 0° sample is selected with multiplexer 102, again as a function of the multiplexer select input mux_sel 101. The selected output is sampled with 0° clock phase using D flip-flop 106 to produce the output 90.

The illustrated example includes a further pair of flip-flops 108,110 for the purpose of re-timing outputs 89,90 to an RTL (register transfer language) clock input 120. The overall clocked outputs are indicated at 109,111, these corresponding to the even bits and the odd bits respectively of the input 56. The entire circuit discussed thus far with respect to bits 0 and 1 of the controller-memory interface is repeated for each bit of the interface. A typical interface width for current designs of personal computers is 64 bits, but other applications have different widths.

Circuit 122 is provided for the purpose of generating the initialization sample. This consists of a D flip-flop 112 that samples DQ0 88. This is re-timed to the 0° clock using flip-flop 114. Optionally, this is re-timed to the RTL clock with flip-flop 116.

To implement the functionality corresponding to the first example 70 of FIG. 2B, depending upon which bit of the interface the circuit 122 is implemented, the DQ0 is sampled with a different clock phase. In the illustrated example, for $DQ_0$ and $DQ_4$ the sampling takes place at the 0° clock phase. For $DQ_1$ and $DQ_5$ the sampling takes place at the 90° clock phase. For $DQ_2$ and $DQ_6$ the sampling takes place at the 180° clock phase. Finally, for $DQ_3$ and $DQ_7$ sampling takes place at the 270° clock phase. The overall result then is an eight bit initialization sample that can be used together with the look-up table of FIG. 3 to determine what the read delay is. This in turn is used to determine when to enable the DQS_enable 80 for normal operations. Alternatively, in an implementation corresponding with the second example 72 of FIG. 2B where two bits are each sampled four times, the circuit 122 would only need to be implemented for two bits of the interface, but would need to be implemented four times such that each bit could be sampled at each of the 0°, 90°, 180°, 270° clock phases.

Note that in an alternate circuit implementation, the circuit 122 can be reproduced for every bit of the interface so that the logic is identical for all bits.

The initialization sample output is changing continuously as a function of the input. The initialization sample is "valid" a predetermined time after the initial READ command.

Another embodiment allows for a larger range of latencies. A three bit Gray code is required for the initialization pattern written to memory to cover the delay range of 16 bit periods. It is no longer possible to capture all four sampling phases of 3 bits in a single byte wide interface with one sampling latch per bit. Either a 12 bit wide interface is required or the individual Gray code bits can be sampled sequentially in separate read operations.

Figure 5:
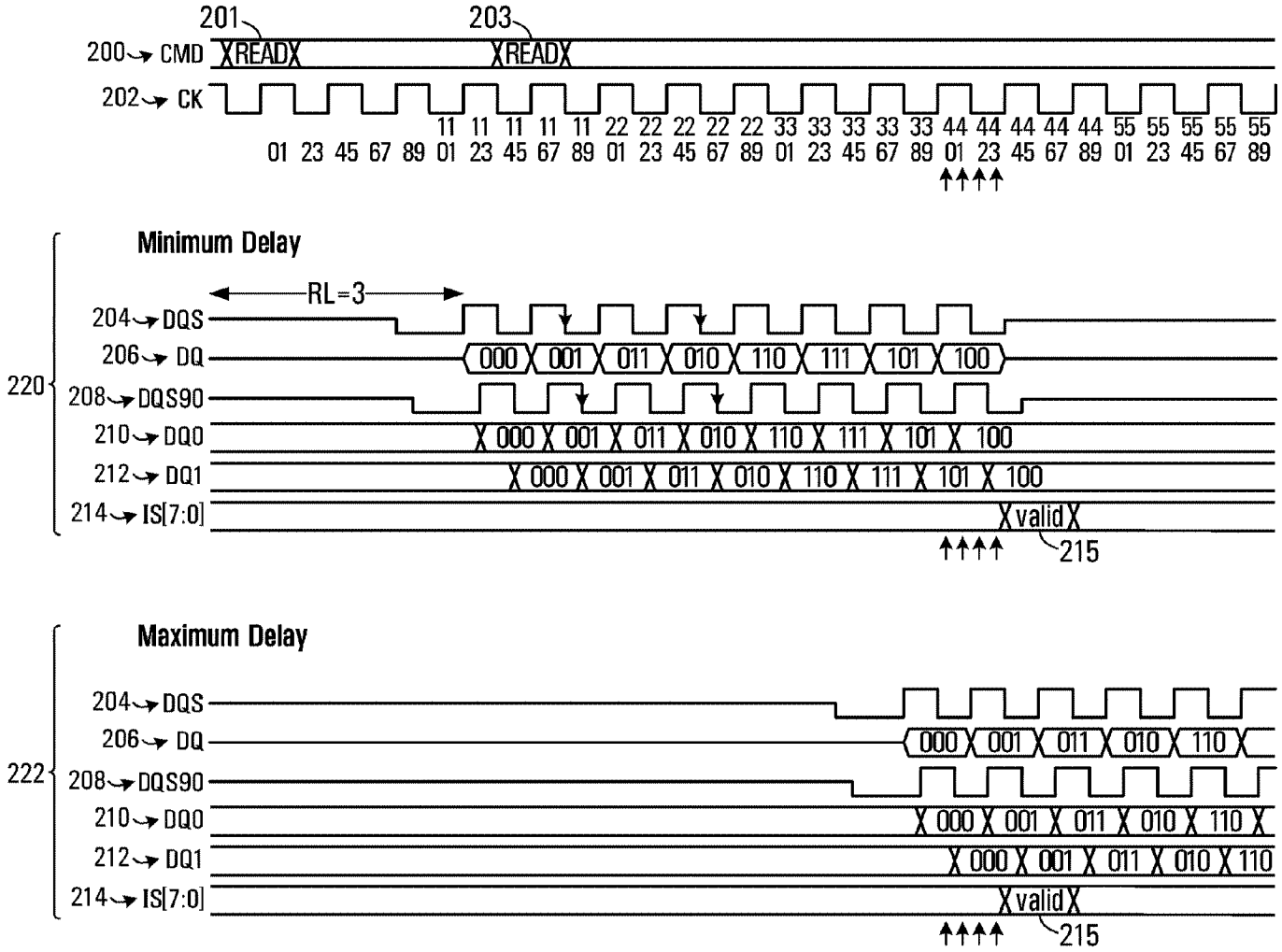
FIG. 5 is another timing diagram for a method of read delay determination.

Referring now to FIG. 5, shown is a timing diagram that will be used to describe this embodiment of the invention. With this embodiment, a three bit Gray code is employed rather than the two bit Gray code discussed above. For example, the following might be the Gray code that is written to successive byte locations in 16 successive 12 bit locations in the memory:

| Time | Bit #:<br>11<br>109876543210 |
|---|---|
| t = 0 | 000000000000 |
| t = 1 | 000000000000 |
| t = 2 | 000000001111 |
| t = 3 | 000000001111 |
| t = 4 | 000011111111 |
| t = 5 | 000011111111 |
| t = 6 | 000011110000 |
| t = 7 | 000011110000 |
| t = 8 | 111100000000 |
| t = 9 | 111100000000 |
| t = 10 | 111100001111 |
| t = 11 | 111100001111 |
| t = 12 | 111111111111 |
| t = 13 | 111111111111 |
| t = 14 | 111111110000 |
| t = 15 | 111111110000 |

In order to read out the entire 16 memory locations, two BL8 (burst length eight) READ commands are performed. This is indicated in the command sequence 200 where there is a BL8 READ 201 and a second BL8 READ 203. Rather than using a Gray counter implemented using dedicated hardware as was the case of FIG. 3, the Gray code counter is implemented in RTL (not shown). In this case, the Gray code counter CK 202 starts counting at zero with the first READ command 201. The received DQS is shown at 204.

For the minimum delay case (RL=3) generally indicated at 220, DQS has a first rising edge on clock count=12. The shorthand notation for the received DQ bits is indicated at 206; the 90 degree DQS clock is at 208; DQ0 (samples taken on the rising edge) and DQ1 (samples taken on the falling edge) of DQS90 are indicated respectively at 210,212. For the example illustrated, it is assumed that the initialization sample is generated during clock counts=40,41,42,43 with the result that there is a valid initialization sample just after that as indicated at 215. The valid initialization sample is then used together with a look-up table to determine what the read delay is, and to then determine when to enable to the DQS enable.

The maximum delay case is indicated generally at 222. In this case, the rising edge of DQS90 does not occur until just after clock count=40 after the maximum read delay that can be accommodated.

FIG. 6 shows the look-up table for this example. In this case, the timing is with reference to the Gray code counter 202.

Figure 7:
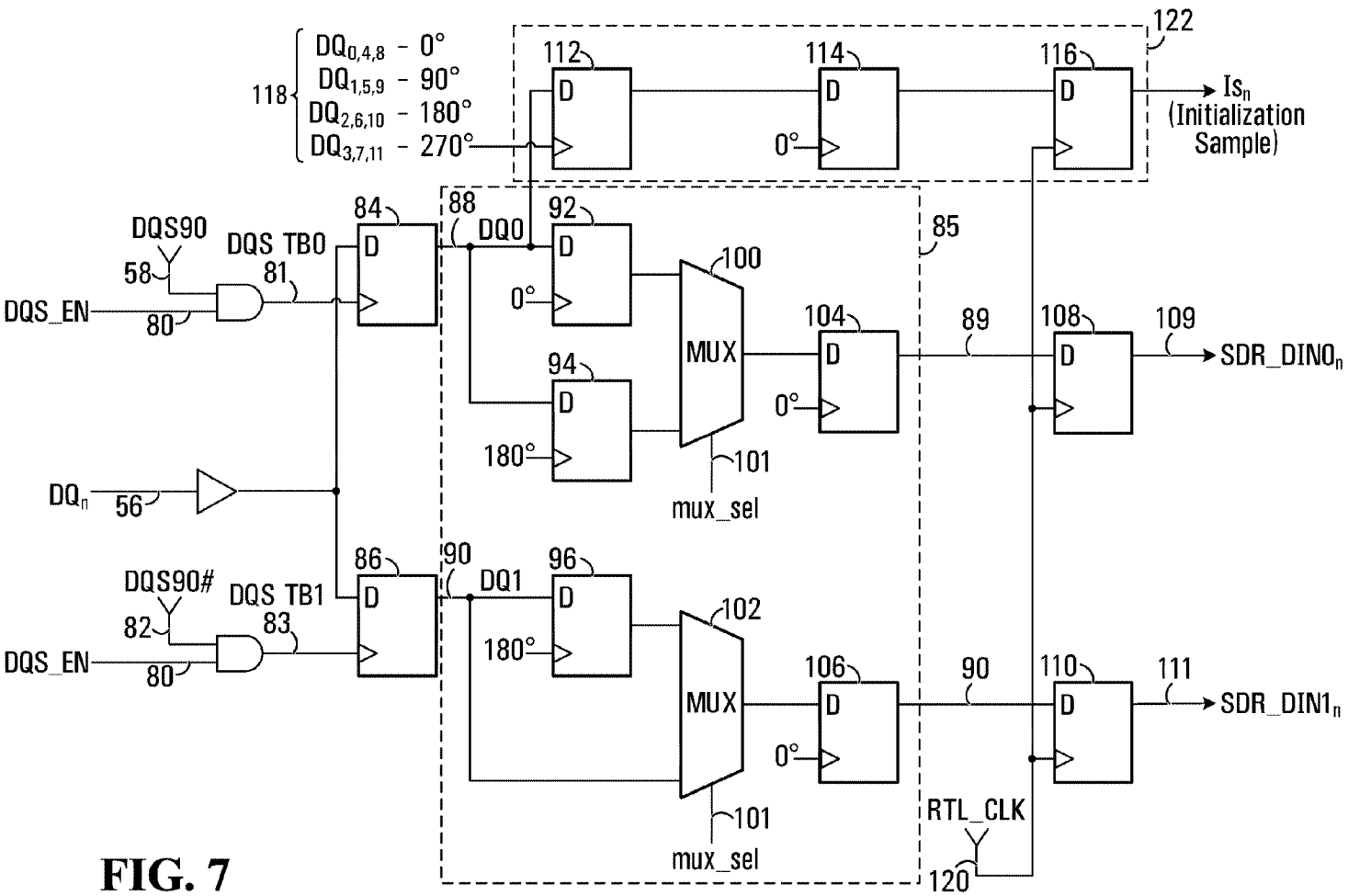
FIG. 7 is a circuit diagram of a circuit for receiving read data and generating an initialization sample corresponding to the example of FIG. 5.

FIG. 7 is a circuit diagram showing an example of an input DQ circuit for the embodiment of FIG. 5. This circuit is basically the same as that of FIG. 4. In this case, the sampling circuits for 12 bits produce 0° samples for $DQ_0$, $DQ_4$, $DQ_8$, 90° samples for $DQ_1$, $DQ_5$, $DQ_9$, 180° samples for $DQ_2$, $DQ_6$, $DQ_{10}$, and 270° samples for $DQ_3$, $DQ_7$ and $DQ_{11}$. The result is a 12 bit initialization sample that can be used to look up an appropriate row in the look-up table of FIG. 6.

More generally, an N bit Gray code can be used. An N-bit Gray code has $2^N$ codewords. In this case, the memory controller writes a Gray code initialization sequence to predetermined locations of the memory by writing each of the $2^N$ codewords to a pair of addresses within $2^{N+1}$ consecutive addresses. This can involve writing N bits to each of the $2^{N+1}$ addresses in which case each bit of the Gray code is sampled with four clock phases. Alternatively, this can involve writing bits of a respective Gray code codeword $g_1$, $g_2, \ldots, g_N$ as 4N bits to each of the $2^{N+1}$ addresses by writing $g_1, g_1, g_1, g_1, \ldots, g_N, g_N, g_N, g_N$ to pairs of addresses. In this case, sampling each bit of the Gray code with four clock phases involves receiving 4N data signals, and sampling N data signals with a first clock phase, sampling another N data signals with a second clock phase, sampling another N data signals with a third clock phase; and sampling another N data signals with a fourth clock phase.

The detailed description above has focused on mechanisms for measuring the read delay. Having determined what the delay is, the DQS enable circuit 32 of FIG. 1 goes on to gate the DQS signal in accordance with the delay thus determined. An example of a specific circuit for the DQS enable circuit 32 will now be described with reference to FIG. 8A. Here it is assumed that both DQS 158 and the inverse of DQS labeled DQS# 160 are received across the interface from the memory. There is a circuit 180 for making the DQS enable circuit of FIG. 8A backwards compatible with DDR memory designs in which there is only a DQS signal, and no DQS#, referred to herein as DDR1 as opposed to DDR2 memories that have both signals. Thus, in DDR1 implementations, the DQS# needs to be generated by the memory controller for that case. Circuit 180 selects between DDR1 and DDR2 mode. The remaining circuitry 182 is responsible for generating a gated DQS# signal 172 (labeled dqsb_i) and a gated DQS signal 173 (labeled dqs_i). If backward compatibility is not required, then circuit 180 is not necessary.

Circuit 182 has a first D flip-flop 144 for receiving an input 141 from the controller, which is asserted at a time corresponding to the read path delay determined by the initialization sample, indicating when it is time to enable the DQS. It also receives a clock input at 140 referred to as CLK (N), this indicating that the controller is able to choose a clock phase for this input. Flip-flop 144 produces output dqs_enable_ff 148. Similarly, a second D flip-flop 146 receives an input 143 from the controller indicating when it is time to disable the DQS. This is clocked by a clock input 142 that is 180° out of phase with the clock 140 that was used to clock the first flip-flop 144. This D flip-flop 146 produces a dqs_disable_ff output 150. The dqs_enable_ff 148 and the inverse of dqs_disable_ff 150 are combined in AND gate 152 the output of which is connected to an S (set) input of SR flip-flop 154. The inverse of dqs_disable_ff 150 is also connected to the D input of SR flip-flop 154. The Q output of flip-flop 154 is a dqs_enable_i 156 and this is connected to a multiplexer select input of a first multiplexer 170 and a second multiplexer 171. The two inputs to the multiplexer 170 include a DQS# input 168, and VDD 169. The output of multiplexer 170 is dqsb_i and this is also input to the clock input of SR flip-flop 154. The two inputs to the multiplexer 171 include a DQS input 166, and VSS 177. The output of multiplexer 171 is dqs_i.

The operation of the circuit of FIG. 8A will now be described with reference to the timing diagram of FIG. 8B. FIG. 8B shows a plot for each of DQS 166, DQS# 168, dqs_enable_ff 148, dqs_disable_ff 150, dqs_enable_i 156 and dqsb_i 172. Note that dqs_i 173 is enabled synchronously with dqsb_i 172. At some point after transmitting a read command, at a time determined by the read delay that was previously measured, the input 141 of D flip-flop 144 goes high under the control of the memory controller. This is clocked in with the rising edge of clock input 140. For the example of FIG. 8B, it can be seen that dqs_enable_ff 178 goes high on the 270° clock phase. When this goes high, the output of AND gate 152 goes high and the set input to SR flip-flop 154 in turn causes dqs_enable_i to transition high. In FIG. 8B it can be seen that dqs_enable_i 156 transitions high slightly after the 270° clock phase. Once dqs_enable_i 156 is high, the DQS# input 168 to multiplexer 170 is selected, and thus the DQS# appears on the dqsb_i 172. When dqs_enable_ff 148 goes low some time later, the set input to SR flip-flop 154 goes low, but the D input is high because it is the inverse of dqs_disable_ff 150. As such, the dqs_enable_i 156 stays high for now. The time between the rising edge of the dqs_enable_ff 148 and the first rising edge of the DQS 166 is greater than a quarter clock cycle. This represents a tolerance for drift between the timing of the DQS and the timing using the main controller. A circuit is described below for detecting when a drift of more than 90° has occurred so that the timing of the dqs_enable can be re-adjusted.

To disable the DQS#, at some later time the disable input 143 to D flip-flop 146 goes high under the control of the memory controller. This is clocked in with a clock that is 180° later than the clock that was used to clock in the enable input to D flip-flop 144. This produces the dqs_disable_ff output 150, the inverted input of which is connected to the D input of SR flip-flop 154. Because of this, on the next rising edge of the clock input to SR flip-flop 154 (i.e. the next rising edge of DQS#) dqs_enable_i goes low. This de-selects the DQS# input 168 to the multiplexer 170, and dqsb_i 172 transitions to VDD. Thus in the timing diagram it can be seen that after the dqs_disable_ff goes high, it is not until the next rising edge of dqsb_i that the dqs_enable_i goes low.

Figure 8A:
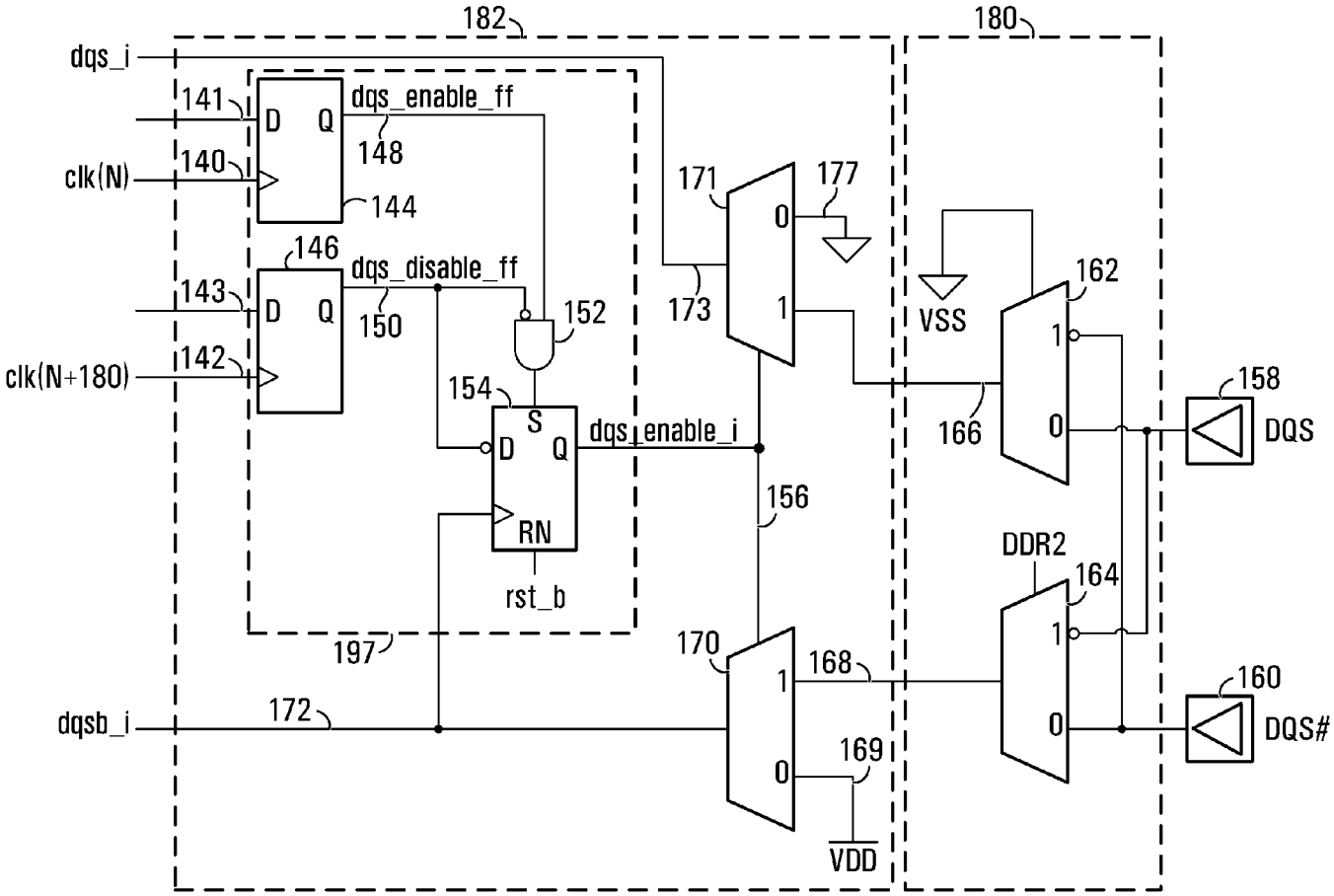
FIG. 8A is a circuit diagram of an example circuit for enabling the DQS once the read delay has been determined.
Figure 8B:
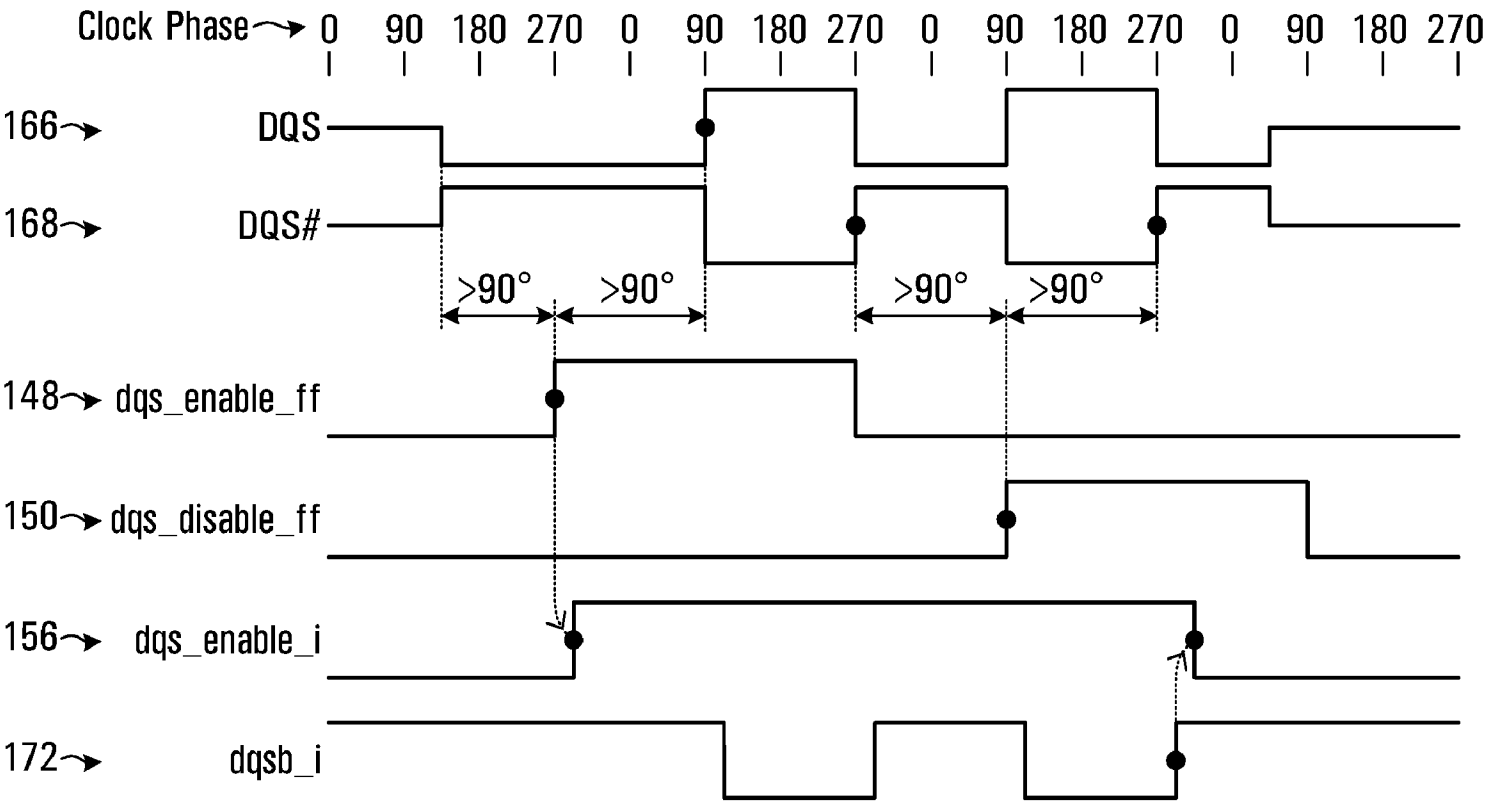
FIG. 8B is an example of a timing diagram corresponding to FIG. 8A.

A specific circuit has been described for producing the multiplexer select input 156, referred to generally as 197 in FIG. 8A. More generally, a select input generator circuit can be used that sets the select input to select the data strobe signal upon activation of the data strobe enable, and that sets the select input to deselect the data strobe signal upon activation of the data strobe disable and following a next rising edge of the data strobe signal.

Circuit 180 simply provides a mechanism for producing DQS# 168 and DQS 166 from the single DQS input 158 for DDR1 implementations. The DQS# input 160 does not exist for DDR1 implementations. Circuit 180 consists of first and second multiplexers 162,164. These are each connected to receive the DQS input 158 and DQS# input 160. Multiplexer 162 always selects DQS 158. When DDR2 is low, multiplexer 164 selects DQS output 168 to be DQS# input 160. Otherwise it is produced from the inverse of DQS 158. The inclusion of multiplexer 162 that always selects DQS 158 ensures an equal load upon DQS and DQS#.

The DQS and DQS# are generated in the memory as a function of a clock received from the memory controller. However, by the time the DQS is received back at the memory controller, this clock has been transmitted from the memory controller to the memory, through the memory's circuits and back out through DQS outputs. The result is that there is some drift between the DQS and DQS# outputs received by the memory controller and the timing of the DQS enable and correspondingly the timing of the dqs_enable_ff, dqs_disable_ff, dqs_enable_i and dqsb_i of FIG. 8B. However, more generally in any DDR SDRAM implementation, the DQS signal can be expected to drift somewhat with respect to main clock. Another embodiment of the invention provides a mechanism for detecting this drift, in particular for detecting when the drift is greater than 90°. Once the drift has reached 90°, this can be corrected for by updating the timing of the DQS enable and disable signals.

Figure 9A:
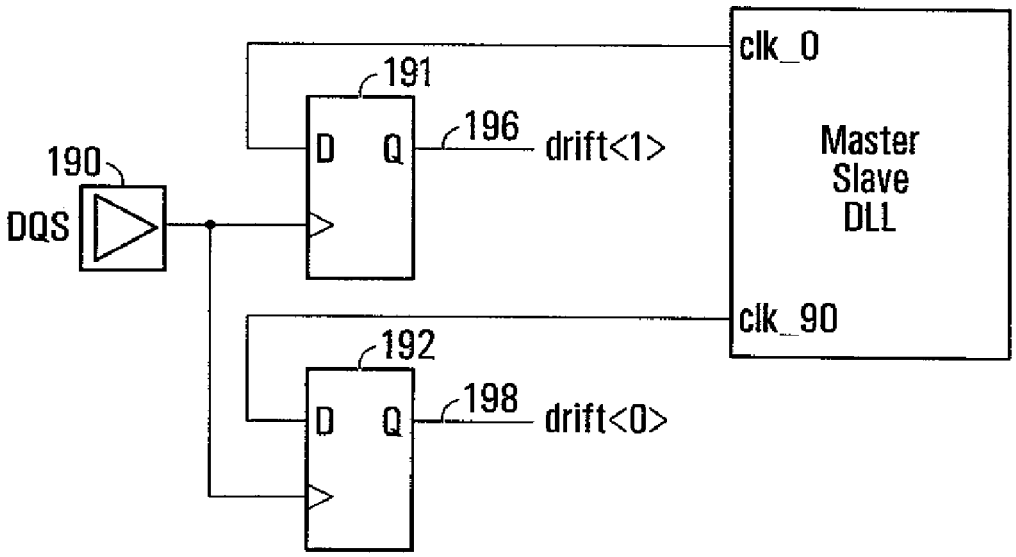
FIG. 9A is a circuit diagram of a circuit for detecting data strobe drift.

Referring now to FIG. 9A, shown is a circuit diagram of a data strobe drift detector provided by an embodiment of the invention. A DQS input 190 is shown driving clock inputs of two D flip-flops 191,192. The D input of flip-flop 191 receives a 0° clock from a master DLL, while the D input of flip-flop 192 receives a 90° phase of the master DLL. The output 196 of the first flip-flop 191 is referred to as drift<1> while the output 198 of the second flip-flop 192 is referred to as drift<0> collectively referred to as "drift outputs".

Figure 9B:
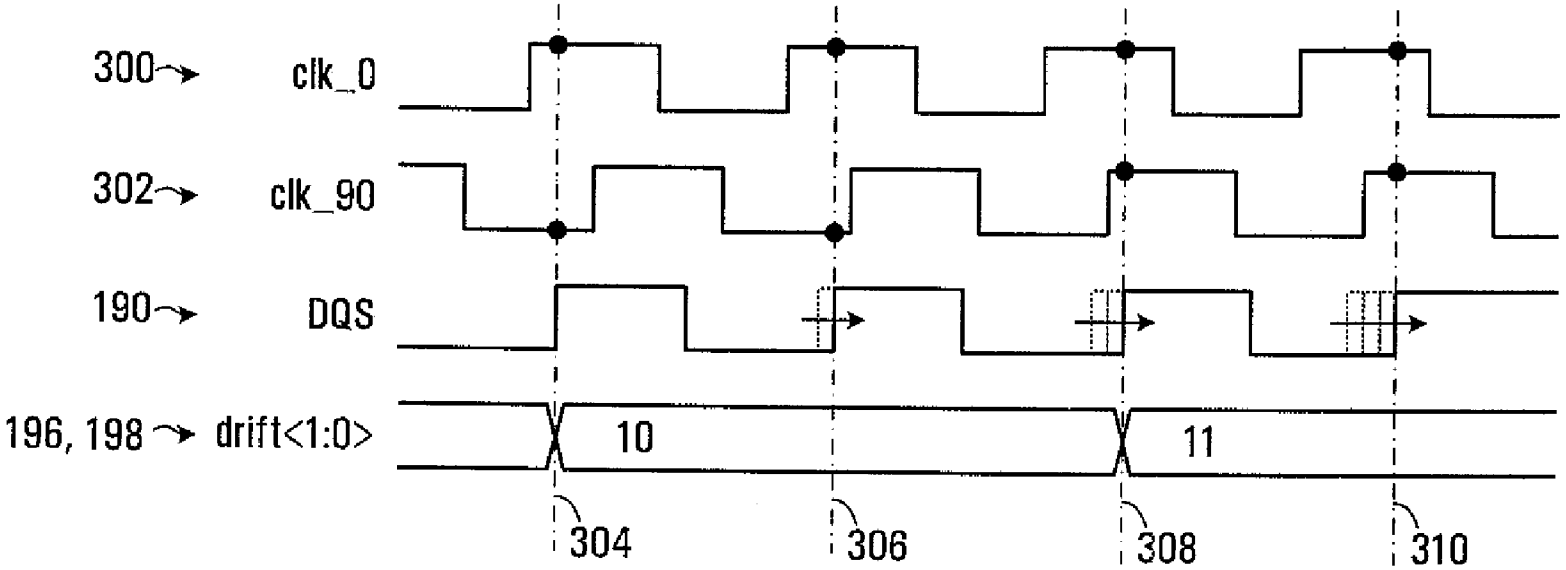
FIG. 9B is an example of a timing diagram corresponding to the circuit of FIG. 9A.

The operation of the circuit of FIG. 9A will now be described with reference to the timing diagram of FIG. 9B. Shown is a 0° clock 300, a 90° clock 302, DQS 190 and drift <1:0> 196,198. When DQS 190 transitions from zero to one (rising edge) the state of the 0° and 90° clocks 300, 302 are latched to the drift outputs 196,198. Four examples of the contents that might be latched are shown in FIG. 9B. In the first example at 304 the drift outputs 196,198 are "10". At a later sampling instant 306 (next rising edge of DQS 190) the drift samples are still "10". At a later sampling instant 308, the drift outputs 196,198 are now "11". This is true again at a later sampling instant 310. The fact that the drift outputs changed from "10" to "11" at sampling instant 308 is indicative of the fact that a drift of greater than 90° has taken place. This information is then used by the memory controller to update the DQS enable and disable times.

It is noted that the DQS enable circuits of FIG. 8A can be used together with any mechanism for determining the read delay. Furthermore, the data strobe drift detector of FIG. 9A can be used in any circuit that receives a DQS signal that is drifting relative to a main clock. A particular application would be in circuits that employ the read delay determination methods and circuits described above and/or the DQS enable schemes described above.

A very specific drift detector circuit has been described. More generally, a first circuit is provided that latches a first value of a first phase of a master clock synchronously with an input clock signal. In the above example, the first circuit is a D flip-flop but other implementations are possible. There is a second circuit that latches a second value of a second phase of the master clock synchronously with the input clock signal. In the above example, the second circuit is a D flip-flop but other implementations are possible. A change in either the first value or the second value indicates that the input clock signal has drifted relative to the master clock source by at least a predetermined amount. For the particular example described, the first clock phase is a 0° clock based on the master clock, and the second clock phase is a 90° clock based on the master clock, and the predetermined amount is a quarter clock cycle, but other shifts can be detected by appropriately selecting the phases of the two clocks.

The specific examples above refer to DDR1 and DDR2. More generally, embodiments of the invention may be applicable to all industry standard DDR DRAMs that use bidirectional data strobes, including DDR, DDR2, DDR3, and the various versions of GDDR. More generally still, embodiments of the invention are applicable to a memory that has a bidirectional read/write bus with source synchronous clocking, and a bidirectional data strobe. The above-discussed DQS is a specific example of such a bidirectional data strobe. In the more general context, a data strobe enable circuit is provided to enable the data strobe, the DQS enable circuit being a specific example of this.

They may also be useful in QDR and QDR2 SRAM to save internal clock power by gating the data clocks and for implementing the clock domain crossing.

Furthermore, the methods and circuits described herein may be used to determine read delay for purposes other than enabling DQS. A specific example is in determining drift and crossing data over clock boundaries.

They may also be useful in high speed serial interfaces. In the embodiments described above, the device elements and circuits are connected to each other as shown in the figures, for the sake of simplicity. In practical applications of the present invention to semiconductor ICs and DRAM devices, elements, circuits, etc. may be connected directly to each other. As well, elements, circuits etc. may be connected indirectly to each other through other elements, circuits, etc., necessary for operation of the semiconductor ICs and DRAM devices. Thus, in actual configuration of semiconductor ICs and DRAM devices, the circuit elements and devices are coupled with (directly or indirectly connected to) each other.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A method for enabling a data strobe input in a synchronous memory controller comprising:

determining a data strobe enable value and a data strobe edge value;

starting a counter upon issuance of a read command;

enabling the data strobe input when an output of the counter reaches the data strobe enable value;

latching the output of the counter with an edge of the data strobe input to provide a data strobe edge sample; and if the data strobe edge sample differs from the data strobe edge value:

adding the difference between the data strobe edge sample and the data strobe edge value to the data strobe enable value, and replacing the data strobe edge value with the data strobe edge sample.

2. The method as claimed in claim 1 wherein latching the output of the counter comprises latching the output of the counter on the first edge of the data strobe input following enabling the data strobe input.

3. The method as claimed in claim 1 wherein latching the output of the counter comprises latching the output of the counter on a rising edge of the data strobe input.

4. The method as claimed in claim 1 further comprising clocking the counter at four times a frequency of the data strobe input.

5. A method for enabling a data strobe input in a synchronous memory controller comprising:

determining a data strobe enable value, a first data strobe edge value, and a second data strobe edge value;

enabling the data strobe input following issuance of a read command at a time determined by the data strobe enable value;

latching a clock with an edge of the data strobe input for providing a first data strobe edge sample;

latching a phase shifted version of the clock with the edge of the data strobe input for providing a second data strobe edge sample; and if the first data strobe edge sample differs from the first data strobe edge value or the second data strobe edge sample differs from the second data strobe edge value:

adjusting the data strobe enable value for compensating for drift, and replacing the first data strobe edge value with the first data strobe edge sample and the second data strobe edge value with the second data strobe edge sample.

6. The method as claimed in claim 5 wherein the clock and the phase shifted version of the clock are latched on a first edge of the data strobe input following enabling the data strobe input.

7. The method as claimed in claim 5 wherein the clock and the phase shifted version of the clock are latched on a rising edge of the data strobe input.

8. The method as claimed in claim 5 wherein a frequency of the phase shifted version of the clock is substantially equal to a frequency of the clock.

9. The method as claimed in claim 8 wherein the phase shifted version of the clock is shifted 90 degrees with respect to the clock.

10. The method as claimed in claim 8 wherein the frequency of the phase shifted version of the clock and the frequency of the clock are substantially equal to a frequency of the data strobe input.

*11. A method for enabling a data strobe input in a synchronous memory controller comprising:*

*determining a data strobe enable value and a data strobe edge value;*

*starting a counter upon issuance of a read command;*

*enabling the data strobe input when an output of the counter reaches the data strobe enable value;*

*latching the output of the counter with an edge of the data strobe input to provide a data strobe edge sample; and*

*adjusting the data strobe enable value based on the data strobe edge sample.*

*12. The method as claimed in claim 11, further comprising adjusting the data strobe edge value based on the data strobe edge sample.*

*13. The method as claimed in claim 12, wherein adjusting the data strobe edge value comprises replacing the data strobe edge value with the data strobe edge sample.*

*14. The method as claimed in claim 11 wherein latching the output of the counter comprises latching the output of the counter on the first edge of the data strobe input following enabling the data strobe input.*

*15. The method as claimed in claim 11 wherein latching the output of the counter comprises latching the output of the counter on a rising edge of the data strobe input.*

*16. The method as claimed in claim 11 further comprising clocking the counter at four times a frequency of the data strobe input.*

* * * * *